(12) United States Patent
Kim et al.

(10) Patent No.: US 7,423,377 B2
(45) Date of Patent: Sep. 9, 2008

(54) PLASMA DISPLAY APPARATUS HAVING A PROTECTION PLATE

(75) Inventors: Ki-Jung Kim, Cheonan-si (KR); Min-Sun Yoo, Cheonan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 519 days.

(21) Appl. No.: 10/974,862

(22) Filed: Oct. 28, 2004

(65) Prior Publication Data
US 2005/0099106 A1 May 12, 2005

(30) Foreign Application Priority Data
Nov. 8, 2003 (KR) ................. 10-2003-0078874

(51) Int. Cl.
*H01J 17/49* (2006.01)
(52) U.S. Cl. .................. 313/582; 313/46; 361/681
(58) Field of Classification Search ......... 313/582–587, 313/46; 315/169.4; 361/681, 688
See application file for complete search history.

(56) References Cited

U.S. PATENT DOCUMENTS

| | | | |
|---|---|---|---|
| 5,541,618 A | 7/1996 | Shinoda |
| 5,661,500 A | 8/1997 | Shinoda et al. |
| 5,663,741 A | 9/1997 | Kanazawa |
| 5,674,553 A | 10/1997 | Sinoda et al. |
| 5,724,054 A | 3/1998 | Shinoda |
| 5,786,794 A | 7/1998 | Kishi et al. |
| 5,831,374 A | 11/1998 | Morita et al. |
| 5,952,782 A | 9/1999 | Nanto |
| 5,971,566 A | 10/1999 | Tani et al. |

(Continued)

FOREIGN PATENT DOCUMENTS

JP 02-148645 6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Toan Ton
*Assistant Examiner*—Bumsuk Won
(74) *Attorney, Agent, or Firm*—Robert E. Bushnell, Esq.

(57) ABSTRACT

A plasma display apparatus includes: a panel on which images are displayed; a circuit board for driving the panel; a chassis base for supporting the panel and the circuit board; a case for accommodating the panel, the circuit board and the chassis base; a signal transfer unit, on which at least one device is mounted, for transmitting electrical signals between the panel and the circuit board by connecting the panel to the circuit board; and a porous protection plate having a plurality of pores, and disposed on an outer surface of the signal transfer unit. In accordance with a further feature of the invention, the case includes a front cabinet disposed in front of the panel, and a porous back cover having a plurality of pores, said porous back cover being disposed on a rear surface of the circuit board and being coupled to the front cabinet.

23 Claims, 7 Drawing Sheets

U.S. PATENT DOCUMENTS

| | | |
|---|---|---|
| 5,990,618 A | 11/1999 | Morita et al. |
| RE37,444 E | 11/2001 | Kanazawa |
| 6,630,916 B1 | 10/2003 | Shinoda |
| 6,707,436 B2 | 3/2004 | Setoguchi et al. |
| 2003/0020152 A1* | 1/2003 | Inoue et al. .................. 257/684 |
| 2003/0171058 A1* | 9/2003 | Hirano et al. .................. 445/24 |
| 2004/0119410 A1* | 6/2004 | Jun et al. .................... 313/582 |

FOREIGN PATENT DOCUMENTS

| | | |
|---|---|---|
| JP | 2845183 | 10/1998 |
| JP | 2917279 | 4/1999 |
| JP | 2001-043804 | 2/2001 |
| JP | 2001-325888 | 11/2001 |

* cited by examiner

PLASMA DISPLAY APPARATUS HAVING A PROTECTION PLATE

CLAIM OF PRIORITY

This application makes reference to, incorporates the same herein, and claims all benefits accruing under 35 U.S.C. §119 from an application for PLASMA DISPLAY APPARATUS earlier filed in the Korean Intellectual Property Office on 8 Nov. 2003 and there duly assigned Serial No. 2003-78874.

BACKGROUND OF THE INVENTION

1. Technical Field

The present invention relates to a plasma display apparatus and, more particularly, to a plasma display apparatus in which heat generated by a panel and other devices is effectively dissipated, electromagnetic interference (EMI) is shielded, and noise is absorbed.

2. Related Art

A plasma display apparatus is a flat panel display that displays images using light emitted from fluorescent materials, which are excited by ultraviolet rays generated from a discharge gas filled in a discharge space when a predetermined voltage is applied across electrodes formed on substrates facing each other. The plasma display apparatus can be formed to a thickness of a few centimeters, and can have a large-sized screen and a viewing angle of more than 150°. Therefore, plasma display apparatuses are expected to be the next generation of display units.

The manufacturing of plasma display apparatuses is completed by coupling a front panel and a rear panel which are separately produced, assembling a chassis base on a backside of the rear panel, mounting a circuit board on the chassis base, and mounting the resultant product in a case.

In the above mentioned plasma display apparatus, the panel operates because the circuit board is electrically connected to the panel by a tape carrier package (TCP), a chip on film (COF), or a chip on board (COB).

A TCP is formed by mounting a device on a tape, and a COF is formed by mounting II a device on a film enclosing a flexible printed cable. The TCP and COF are widely used since the TCP and COF can reduce the size of the circuit board by mounting multiple devices on a tape and a film, respectively, and since they have flexibility.

However, in the above mentioned TCP, COF and COB, a lot of heat and electromagnetic interference (EMI) are generated. The heat and EMI are leaked to the outside from the devices mounted on the TCP, COF or COB during the operation of the panel. The heat can cause problems when displaying images on the panel by causing malfunctions in the devices mounted on the TCP, COF or COB, and the EMI can cause unstable signal processing by affecting the circuit board. Therefore, means for dissipating heat and for shielding EMI produced by the TCP, COF or COB are required.

The plasma display apparatus generates heat during operation, and the heat can reduce the display performance of the panel. Moreover, the reliability of the circuit board can be reduced after long hours of operation due to the heat. Also, the substrates that constitute the panel can be damaged by thermal stress. Some examples of problems relating to heat in plasma display apparatuses are disclosed in U.S. Pat. No. 5,831,374, U.S. Pat. No. 5,971,566, and U.S. Pat. No. 5,990,618.

SUMMARY OF THE INVENTION

The present invention provides a plasma display apparatus that can block the transfer of heat generated by a panel to devices, effectively dissipate heat generated by the devices, shield EMI, and reduce noise.

According to an aspect of the present invention, there is provided a plasma display apparatus comprising: a panel for displaying images; a circuit board that drives the panel; a chassis base that supports the panel and the circuit board; a case that accommodates the panel, the circuit board, and the chassis base; a signal transfer unit in which at least a device is mounted, the signal transfer unit transferring electrical signals between the panel and the circuit board by connecting them; and a porous protection plate having a plurality of pores, and disposed on the exterior of the signal transfer unit.

According to another aspect of the present invention, there is provided a plasma display apparatus comprising: a panel for displaying images; a circuit board that drives the panel; a chassis base that supports the panel and the circuit board; a signal transfer unit, on which at least one device is mounted, the signal transfer unit transferring electrical signals between the panel and the circuit board by connecting them; a case that accommodates the panel, the circuit board, and the chassis base, the case including a front cabinet disposed in front of the panel and a porous back cover having a plurality of pores disposed on a rear side of the circuit board and coupled with the front cabinet.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
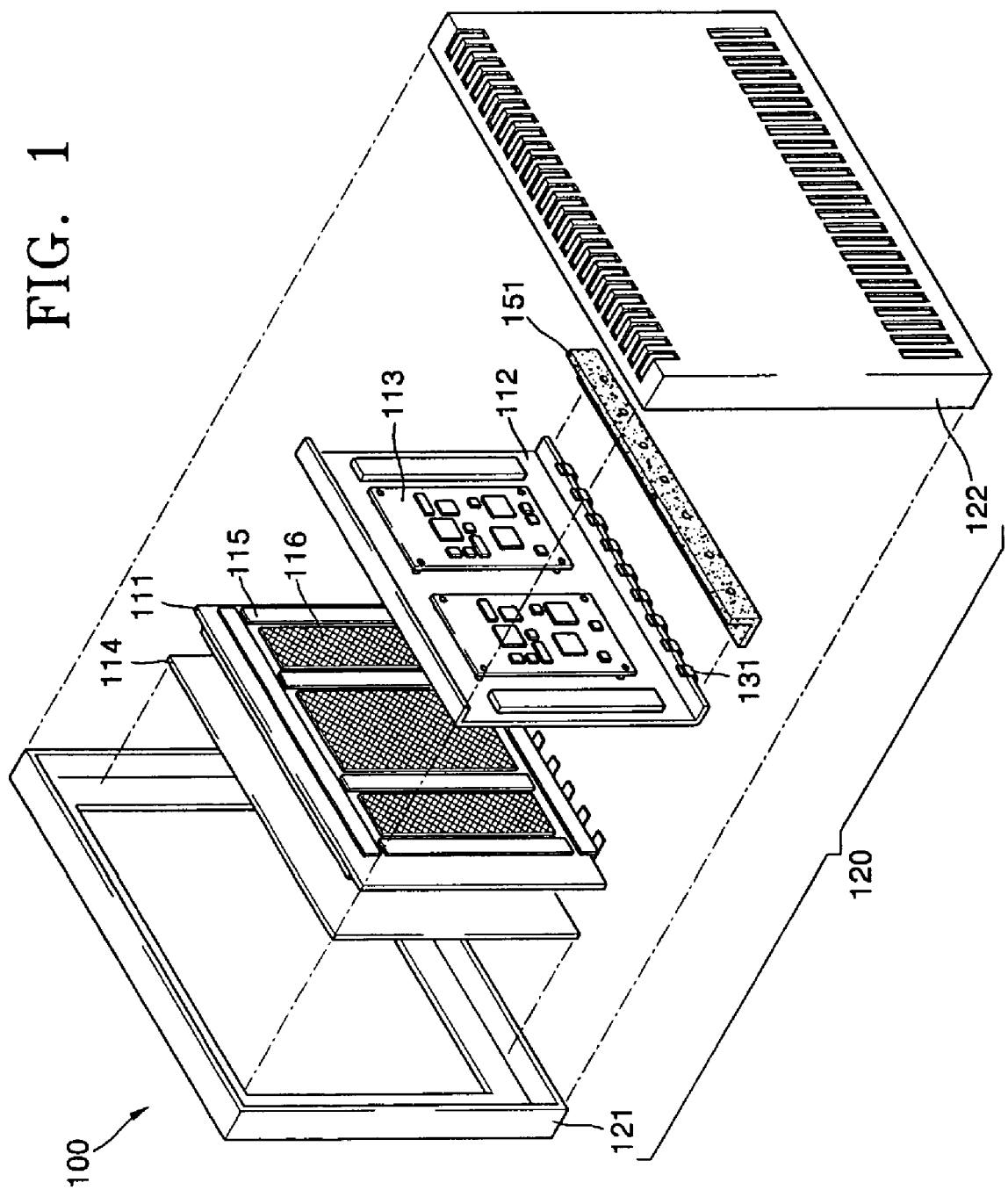
FIG. 1 is an exploded perspective view of a plasma display apparatus according to a first embodiment of the present invention.
Figure 2:
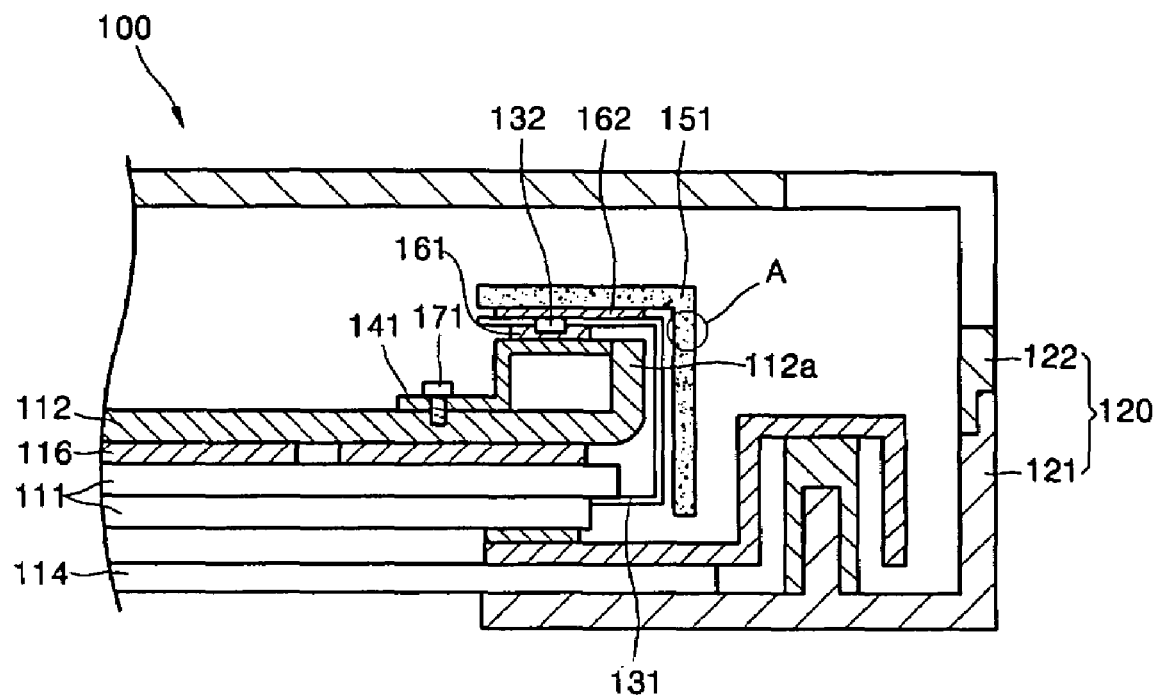
FIG. 2 is a side cross-sectional view of the plasma display apparatus of FIG. 1.

FIG. 1 is an exploded perspective view of a plasma display apparatus according to a first embodiment of the present invention, and FIG. 2 is a side cross-sectional view of the plasma display apparatus of FIG. 1.

Referring to FIGS. 1 and 2, the plasma display apparatus 100 according to the first embodiment of the present invention includes a panel 111, a chassis base 112 that supports the panel 111, and a circuit board 113 disposed on a rear of the chassis base 112.

The panel 111 includes a front panel and a rear panel.

The front panel comprises a plurality of strip shaped sustain electrodes, bus electrodes connected to each of the sustain electrodes, a front dielectric layer that buries the sustain electrodes and the bus electrodes, and a protective layer coated on a surface of the front dielectric layer. The rear panel, which is coupled to the front panel with a space sealed between the front panel and the rear panel, comprises a plurality of address electrodes perpendicular to the sustain electrodes, a rear dielectric layer that buries the address electrodes, barrier ribs formed on the rear dielectric layer that define discharge spaces and prevent cross-talk, and fluorescent layers coated inside the discharge spaces for producing red, green and blue light.

A filter 114 is mounted on the panel 111, and the filter 114 includes an EMI shielding layer for shielding electromagnetic waves which are generated during the operation of the panel, and which are harmful to humans.

The chassis base 112 is disposed on a rear side of the panel configured as above, and the chassis base 112 supports the panel 111 and dissipates heat transferred from the panel 111.

The panel 111 is fixed to the chassis base 112 by an adhesive member, such as double sided-tape. A heat transfer member 116, which is a heat transfer medium, is interposed between the panel 111 and the chassis base 112. The heat transfer member 116 can be formed of a plurality of partitioned sheets as depicted in FIG. 1, and allows heat generated by the panel 111 to dissipate outside the plasma display apparatus 100 via the chassis base 112.

The circuit board 113 is mounted on a rear surface of the chassis base 112 coupled with the panel 111. Electronic components that drive the panel 111 are mounted on the circuit board 113, and the electronic components comprise various parts, such as parts for supplying power to the panel 111 and parts for transmitting signals for displaying images on the panel 111.

The panel 111 and the chassis base 112 are accommodated in a case 120 which can include a front cabinet 121 mounted in front of the panel 111 and a back cover 122 mounted on a rear of the chassis base 112.

The circuit board 113 operates the panel 111 by transferring an electrical signal to the panel 111 via a signal transfer unit. According to an embodiment of the present invention, the signal transfer unit is a TCP 131 (see FIG. 2) in which at least a device 132, such as a driving IC, is mounted.

More specifically, referring to FIG. 2, one end of the TCP 131 is connected to the panel 111 via the chassis base 112, and the other end of the TCP 131 is connected to the circuit board 113. The TCP 131, which includes the device 132, can be disposed on a reinforcing member 141 mounted on at least a surface of the chassis base 112. In this case, grease 161 for dissipating heat can be interposed between the device 132, which is mounted the TCP 131, and the reinforcing member 141.

The reinforcing member 141 can be formed of metal. The reinforcing member 141 prevents bending of the chassis base 112, and increases the dissipation efficiency of heat transferred from the chassis base 112 by increasing a dissipation surface area. An end of the reinforcing member 141 is fixed to the chassis base 112 by a screw 171, a rivet or a TOX, and the other end of the reinforcing member 141 can be mounted on a bent portion 112a of the chassis base 112 so as to reinforce the chassis base 112.

A heat transfer member 162 for dissipating heat generated during the operation of the device 132 is disposed on an exposed outer surface of the device 132, which is mounted on the TCP 131, which is disposed on the reinforcing member 141. The heat transfer member 162 can be a sheet composed of a soft material that absorbs an impact so as to prevent the impact from affecting the device 132.

A protection plate 151 can be disposed on an outer surface of the heat transfer member for device 162, according to an embodiment of the present invention.

An end of the protection plate 151 contacts the heat transfer member 162, and the other end of the protection plate 151 surrounds an outer surface of the TCP 131, which is disposed on an end of the chassis base 112, to protect the TCP 131. To provide these features, the protection plate 151 has a 90° bend. The protection plate 151 is coupled to chassis base 112 by a conventional fixing method, such as a screw or a rivet.

Figure 3:
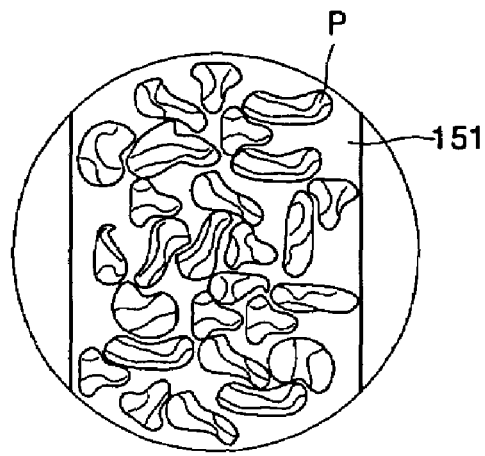
FIG. 3 is a cross-sectional view of a protecting plate in region A of FIG. 2.

Also, as depicted in FIG. 3, the protection plate 151 has a porous structure including a plurality of pores P formed within the structure by a pore generation process within the structure. The protection plate 151 can be formed of a metal selected form the group consisting of Al, Cu, Ag, Au, Fe, Ni, stainless steel and brass, or it can be formed of a material selected form the group consisting of carbon, graphite, carbon nanotube and carbon fiber.

The pores P allow air to flow through the protection plate 151 and increase a contact area with the air. Accordingly, heat generated by the device 132, which is mounted on the TCP 131, is sequentially transferred to the protection plate 151 via the heat transfer member 162, and the heat transferred to the protection plate 151 is dissipated to the outside by convection. Also, EMI generated by the device 132, which is mounted on the TCP 131, can be shielded by absorption since the protection plate 151 is grounded via the chassis base 112.

As described above, according to an embodiment of the present invention, heat generated by the panel 111 is dissipated to the outside as a result of being transferred to the chassis base 112 via the heat transfer member 116, and heat generated by the device 132, which is mounted on the TCP 131, is dissipated to the outside as a result of being transferred to the chassis base 112 through the reinforcing member 141, and as a result of being transferred to the protection plate 151 via the heat transfer member 162. In addition, EMI generated by the device 132, which is mounted on the TCP 131, is shielded by the protection plate 151.

Figure 4:
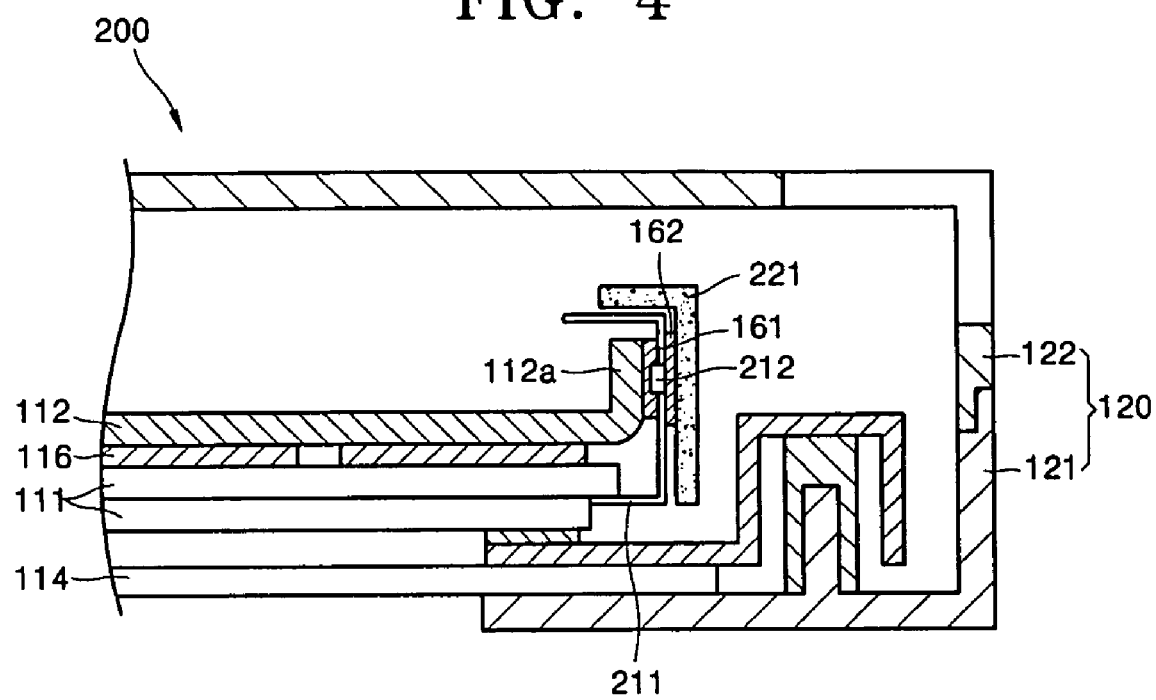
FIG. 4 is a side cross-sectional view of a plasma display apparatus according to a second embodiment of the present invention.

FIG. 4 is a cross-sectional view of a plasma display apparatus according to a second embodiment of the present invention. The description of elements included in both FIG. 2 and FIG. 4 will be omitted since like reference numerals refer to like elements.

Referring to FIG. 4, the reinforcing member 141 included in the first embodiment is omitted from the plasma display apparatus 200 according to the second embodiment.

More specifically, an end of a TCP 211 is connected to the panel 111 via a chassis base 112, and the other end of the TCP 211 is connected to a circuit board 113, while a device 212 mounted on the TCP 211 is disposed on a bent portion 112a of a chassis base 112.

A heat transfer member 162 is disposed on an exposed outer surface of the device 212, which is mounted on the TCP 211, and disposed on the chassis base 112, and a protection plate 221 is mounted on an outer surface of the heat transfer member 162.

The protection plate 221 has a 90° bend to protect both the heat radiation unit 162 and the TCP 211 by surrounding them, and is coupled to the chassis base 112 using a conventional fixing method, such as a screw or a rivet, as in the first embodiment of the present invention. Thus, the protection plate 221 is grounded.

In addition, the protection plate 221, like the protection plate 151 depicted in FIG. 3, has a porous structure including a plurality of pores P generated through a pore generation process. The protection plate 221 can be formed of a metal selected form the group consisting of Al, Cu, Ag, Au, Fe, Ni, stainless steel and brass, or it can be formed of a material selected from the group consisting of carbon, graphite, carbon nanotube and carbon fiber.

Since the plasma display apparatus 200 has the above configuration, heat generated by the panel 111 is transferred to the chassis base 112 by the heat transfer member 116 and is dissipated to the outside, while heat generated by the device 212, which is mounted on the TCP 211, is dissipated to the outside through the protection plate 221 via the heat transfer member 162 as well as the chassis base 112. In addition, EMI generated by the device 212, which is mounted on the TCP 211, can be shielded by means of the protection plate 221.

Figure 5:
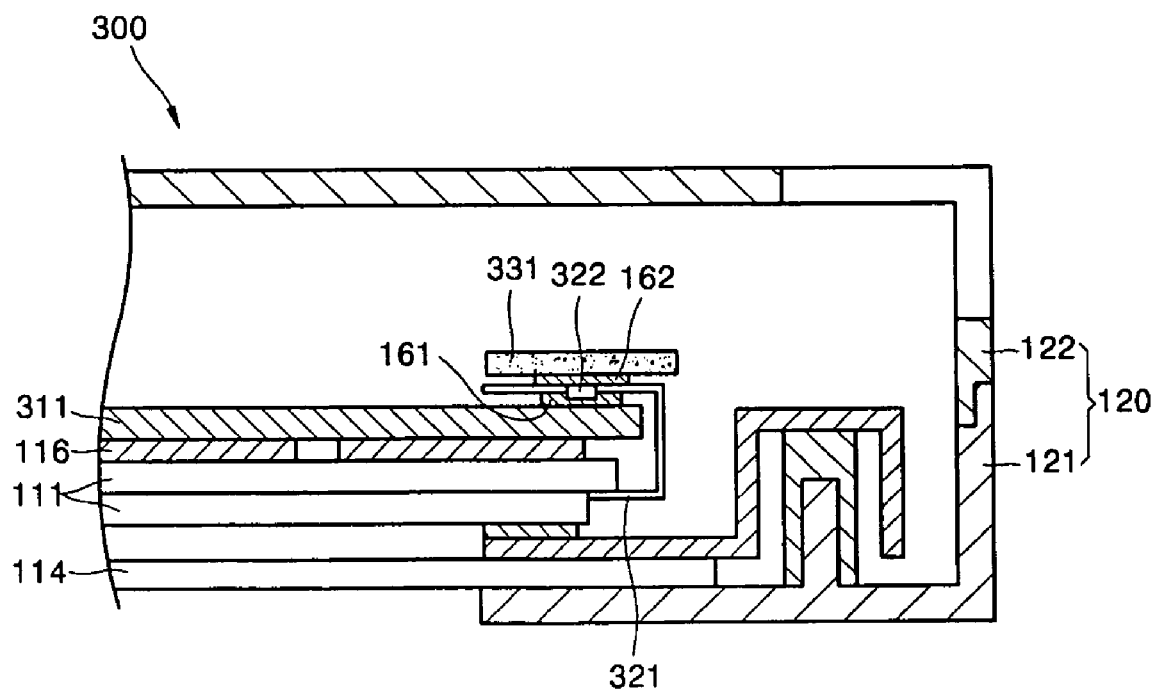
FIG. 5 is a side cross-sectional view of a plasma display apparatus according to a third embodiment of the present invention.

FIG. 5 is a cross-sectional view of a plasma display apparatus according to a third embodiment of the present invention.

Referring to FIG. 5, the plasma display apparatus 300 according to the present embodiment includes a chassis base 311 which, unlike the chassis base 112 of FIGS. 2 and 4, does not have a bent portion 112a.

More specifically, an end of a TCP 321 is connected to the panel 111 via an end of the chassis base 311, and the other end of the TCP 321 is connected to a circuit board 113. A device 322 mounted on the TCP 321 is disposed on an edge of the chassis base 311. A heat transfer member 162 is disposed on an exposed exterior of the device 322, which is mounted on the TCP 321, and a protection plate 331 is disposed on an outer surface of the heat transfer member 162.

The protection plate 331 is formed of a leaf member which is parallel to the chassis base 311, but is not limited thereto. The protection plate 331 can be bent at 90°, as in the previous embodiments. The protection plate 331 can be coupled to the chassis base 311 using a conventional method, such as a screw or a rivet, and can be grounded.

In addition, the protection plate 331, as was the case with the protection plate 151 depicted in FIG. 3, has a porous structure having a plurality of pores P generated through a pore generation process. The protection plate 331 can be formed of a metal selected form the group consisting of Al, Cu, Ag, Au, Fe, Ni, stainless steel and brass, or it can be formed of a material selected from the group consisting of carbon, graphite, carbon nanotube and carbon fiber.

Since the plasma display apparatus 300 has the above configuration, heat generated by the panel 111 is transferred to the chassis base 311 by the heat transfer member 116 and is dissipated to the outside. Heat generated from the device 322 mounted on the TCP 321 is dissipated to the outside through the protection plate 331 via the heat transfer member 162 as well as through the chassis base 311. Also, EMI generated by the device 322, which is mounted on the TCP 321, can be shielded by the protection plate 331.

Figure 6:
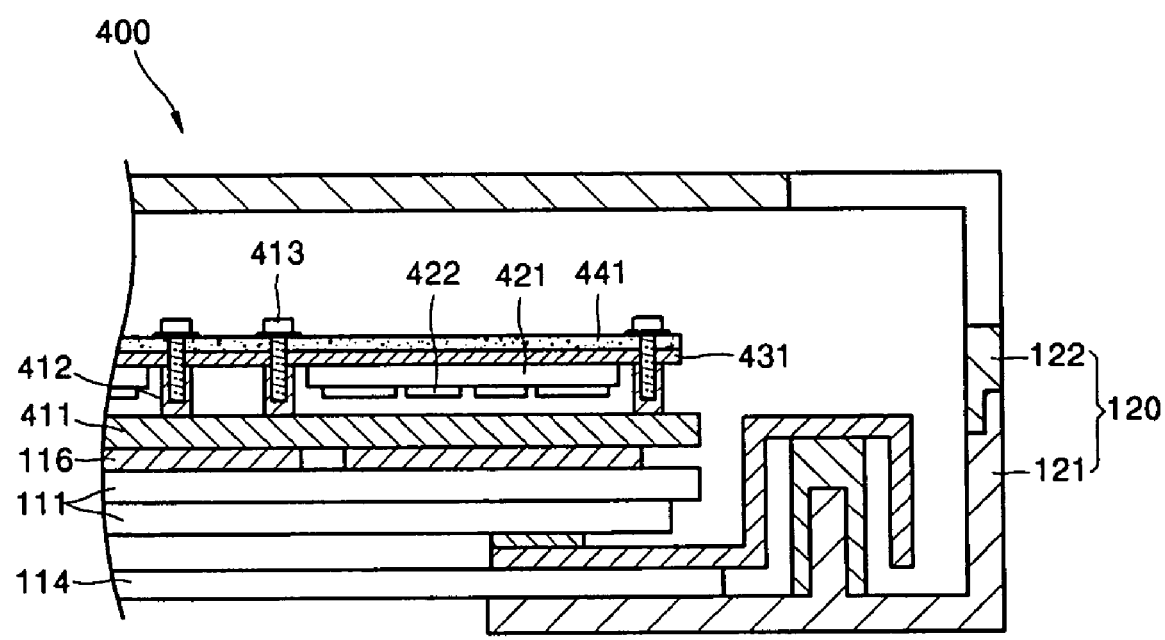
FIG. 6 is a side cross-sectional view of a plasma display apparatus according to a fourth embodiment of the present invention.

FIG. 6 is a cross-sectional view of a plasma display apparatus according to a fourth embodiment of the present invention.

Referring to FIG. 6, the plasma display apparatus 400 according to the present embodiment includes a COF 421 in which a device is mounted on a film constituting a FPC as a signal transfer unit.

More specifically, the COF 421 is mounted on a rear surface of a chassis base 411 by coupling with a reinforcing plate 431. The reinforcing plate 431, like the heat transfer member162 in the previous embodiments, dissipates heat generated by the COF 421 and supports the COF 421. A protection plate 441 according to an aspect of the present invention is disposed on a back surface of the reinforcing plate 431.

The protection plate 441 is formed of a leaf member, and is mounted on the reinforcing plate 431 in tight contact with the reinforcing plate 431. The protection plate 441 and the reinforcing plate 431 are coupled by a conventional fixing means, such as screws 413, through a plurality of boss portions 412 formed on a rear surface of the chassis base 411 and can be grounded to the chassis base 411. A predetermined space can exist between a front surface of the COF 421 and a rear surface of the chassis base 411 to prevent a short circuit between a capacitor disposed on the COF 421 and the chassis base 411, and to prevent the direct transfer of heat from the chassis base 411 to the COF 421.

Also, as was the case with the protection plate 151 depicted in FIG. 3, the protection plate 441 has a porous structure including a plurality of pores P generated through a pore generation process. The protection plate 441 can be formed of a metal selected form the group consisting of Al, Cu, Ag, Au, Fe, Ni, stainless steel and brass, or it can be formed of a material selected from the group consisting of carbon, graphite, carbon nanotube and carbon fiber.

Since the plasma display apparatus 400 has the above configuration, heat generated by the panel 111 is transferred to the chassis base 411 by the heat transfer member 116 and is dissipated to the outside, and heat generated from the device 422, which is mounted on the COF 421, is dissipated to the outside through the protection plate 441 via the reinforcing plate 431 as well as through the chassis base 411. Also, EMI generated by the device 422, which is mounted on the COF 421, can be shielded by the protection plate 441.

Figure 7:
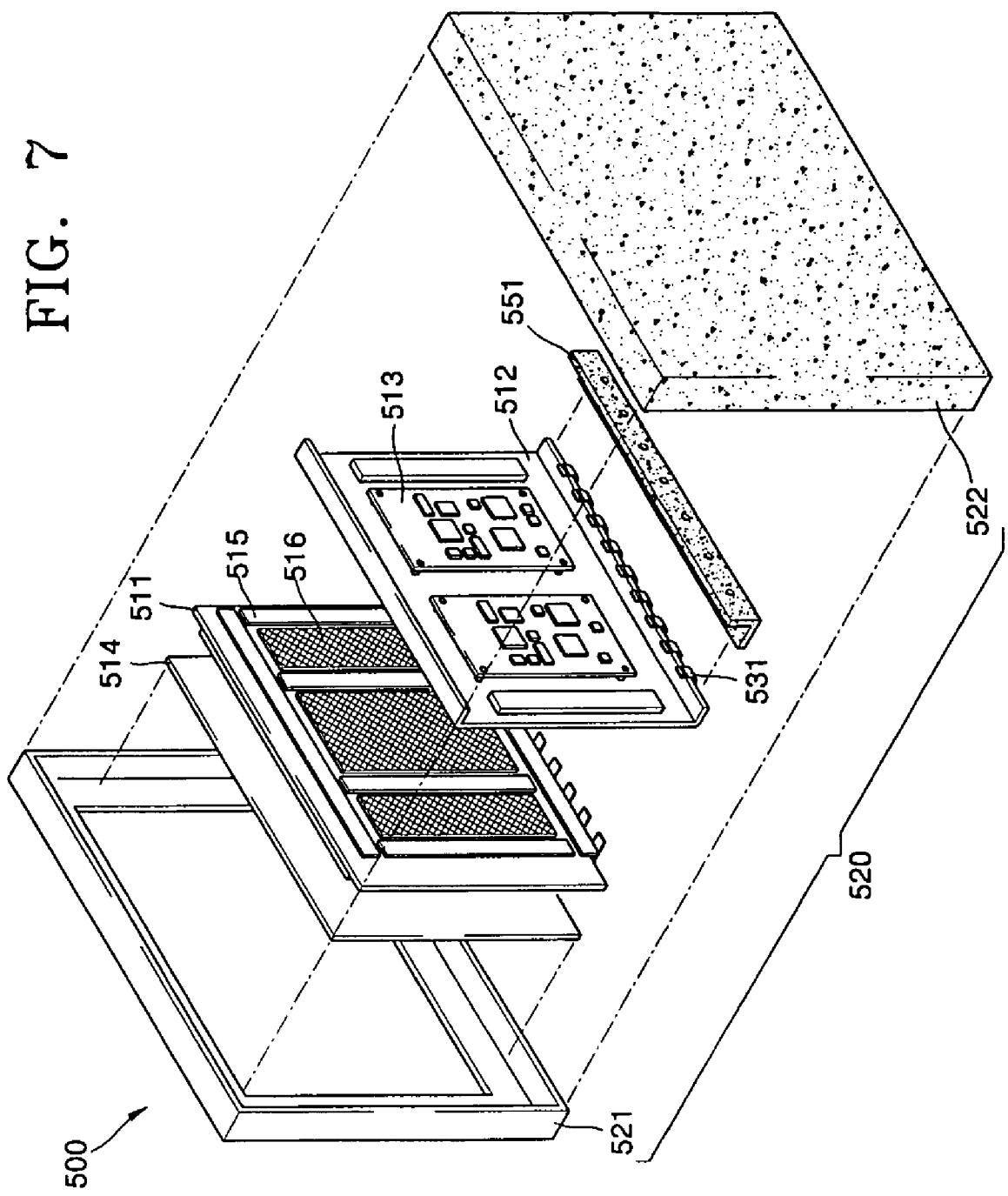
FIG. 7 is an exploded perspective view of a plasma display apparatus according to a fifth embodiment of the present invention.
Figure 8:
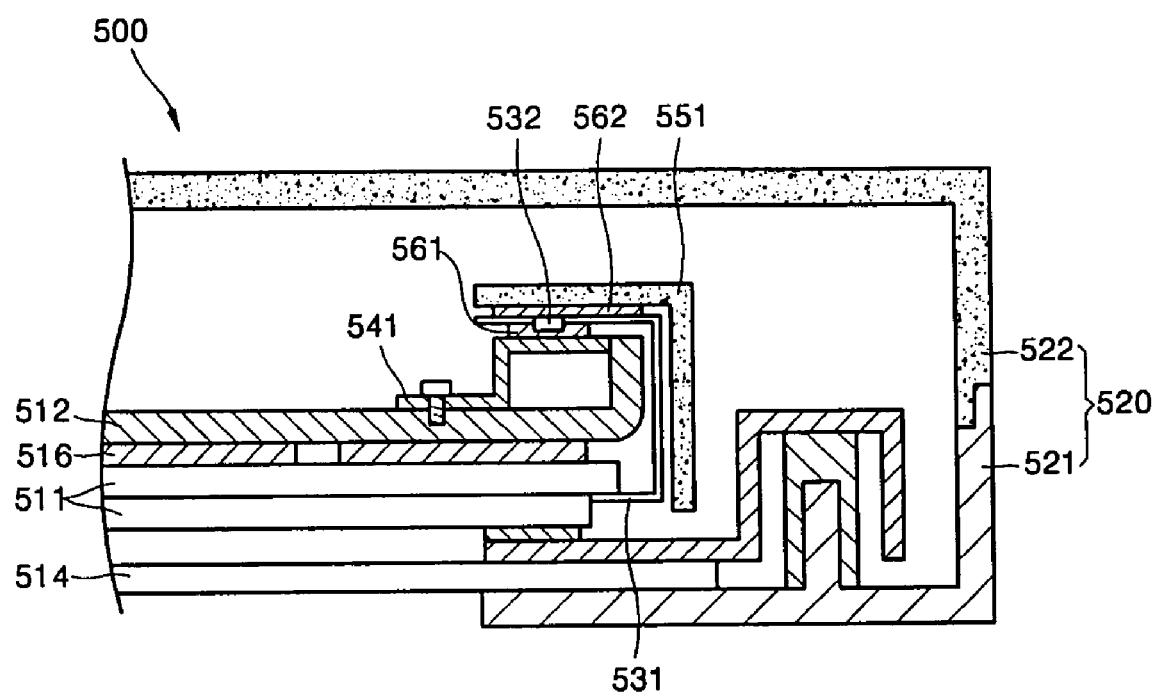
FIG. 8 is a side cross-sectional view of the plasma display apparatus of FIG. 7.

FIG. 7 is a perspective view of a plasma display apparatus according to a fifth embodiment of the present invention. FIG. 8 is a side cross-sectional view of the plasma display apparatus of FIG. 7.

Referring to FIGS. 7 and 8, the plasma display apparatus 500 according to the present embodiment includes a panel 511, a chassis base 512 that supports the panel 511, and a circuit board 513 mounted between the panel 511 and the chassis base 512. A filter 514 is mounted in front of the panel 511. The chassis base 512 and the panel 511 are coupled by a double-sided tape. A heat transfer member 516, which is a heat conductor, is disposed between the chassis base 512 and the panel 511. In addition, the circuit board 513 operates the panel 511 by transmitting electrical signals to the panel 511 via a signal transfer unit. A TCP 531 is depicted as the signal transfer unit in the drawings, but a COF, as described in the previous embodiments, can also be used.

The TCP 531 can be disposed on a reinforcing member 541 mounted on at least a side of the chassis base 512. Grease 561 for dissipating heat can be interposed between a device 532 mounted on the TCP 531 and the reinforcing member 541. A heat transfer member 562, which dissipates heat generated from the device 532, can be disposed on an exposed outer surface of the device 532 mounted on the TCP 531.

In addition, the TCP 531 is protected by a surrounding protection plate 551. The protection plate 551 can have a porous structure including a plurality of pores to radiate heat generated by the device 532 which is mounted on the TCP 531 and to shield EMI, or it can have a structure without pores.

The panel 511 and the chassis base 512 having the above structure are accommodated in a case 520, and according to an embodiment of the present invention, the case 520 can comprise a front cabinet 521 disposed in front of the panel 511 and a back cover 522 mounted on a rear surface of the chassis base 512.

The back cover 522, as is the case with the protection plate 151 depicted in FIG. 3, has a porous structure including a plurality of pores P generated through a pore generation process. In this case, the back cover 522 can be formed of a metal selected form the group consisting of Al, Cu, Ag, Au, Fe, Ni, stainless steel and brass, or it can be formed of a material selected from the group consisting of carbon, graphite, carbon nanotube and carbon fiber. The back cover 522 can be grounded to the chassis base 512.

The pores P allow air to flow through the back cover 522, and can increase the surface area in contact with the air. Accordingly, heat generated by the device 532, which is mounted on the TCP 531, or by the circuit board 513 can be transferred to the back cover 522 by radiation, and then can be dissipated to the outside of the panel 511 by convection. In addition, EMI generated by the device 532, which is mounted on the TCP 531, or by the circuit board 513 can be shielded since the back cover 522 is grounded to the chassis base 512. Also, noise in the case 520 can be reduced as a result of absorption by the pores P.

The back cover 522 can further include breather holes, as in the prior art, but can have a structure without breather holes since the back cover 522 has a porous structure including a plurality of pores P through which air can flow. Moreover, the efficiency of radiating heat converted from EMI can be improved by coloring an inner surface of the back cover 522 black.

Figure 9:
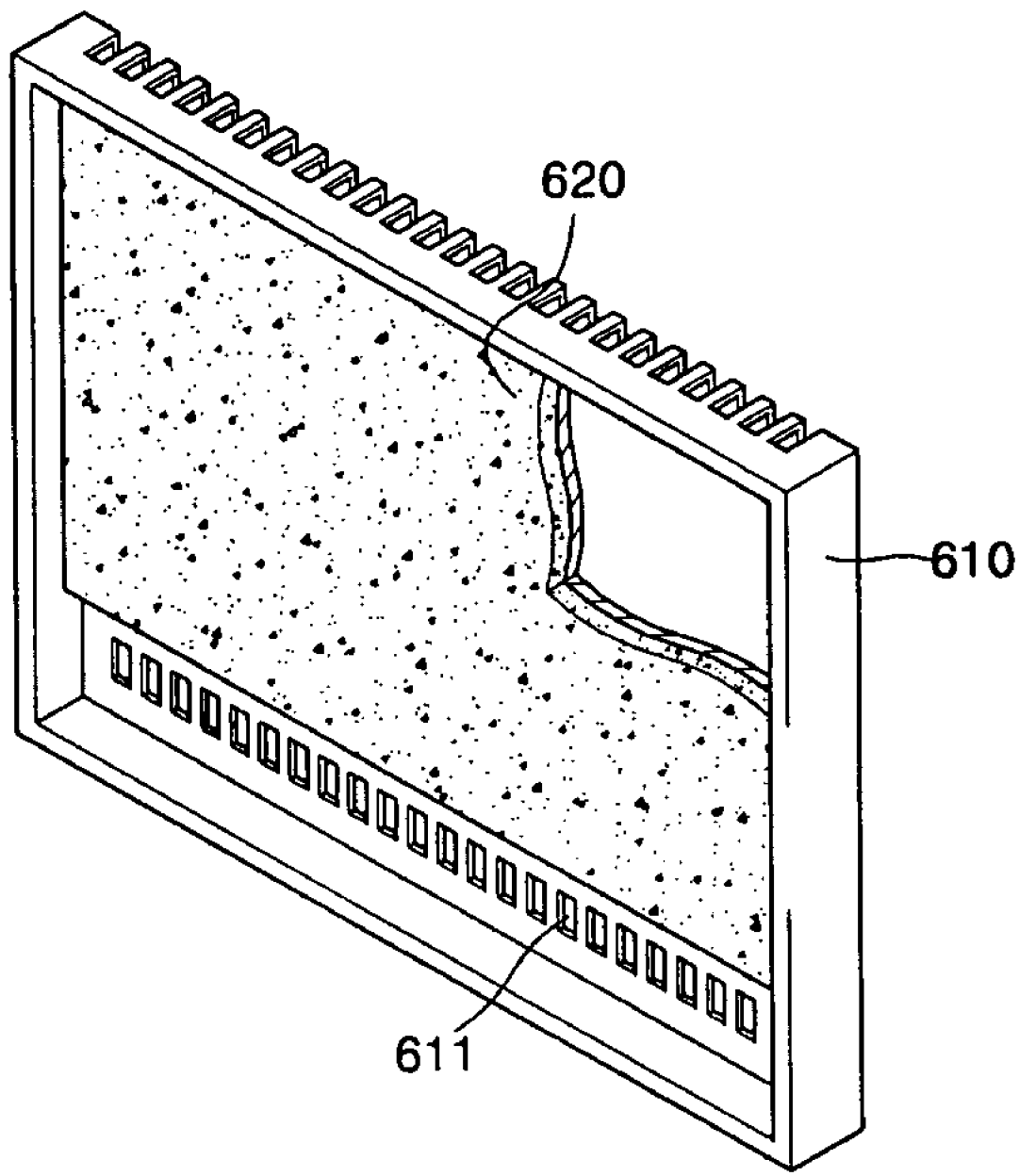
FIG. 9 is a perspective view of a back cover according to another embodiment of the present invention.

The back cover 522 is not limited to the above described structure, but can have the structure depicted in FIG. 9.

Referring to FIG. 9, a stacking portion 620 is disposed on an inner surface of a back cover 610. The back cover 610 has a conventional structure, and not a porous structure, but it has a plurality of breather holes 611. On the other hand, as in the case of the protection plate 151 depicted in FIG. 3, the stacking portion 620 disposed on the inner surface of the back cover 610 has a porous structure including a plurality of pores P generated through a pore generation process. In this case, the stacking portion 620 can be formed of a metal selected from the group consisting of Al, Cu, Ag, Au, Fe, Ni, stainless steel and brass, or it can be formed of a material selected from the group consisting of carbon, graphite, carbon nanotube and carbon fiber. The stacking portion 620 can be grounded to the chassis base 512.

Heat generated by the device 532, which is mounted on the TCP 531, or by the circuit board 513 is transferred to the stacking portion 620 by radiation, and is then transferred by convection and dissipated to the outside through the breather holes 611. EMI generated by the device 532, which is mounted on the TCP 531, or by the circuit board 513 is shielded by absorption since the stacking portion 620 is grounded to the chassis base 512. Also, noise in the case 520 can be reduced as a result of absorption by the pores P.

As described above, according to the present invention, heat generated in the panel can be fluently discharged to the outside, and noise can be reduced. The effect of heat and EMI on the device and on the circuit board can be minimized since the efficiency of dissipating heat generated by the device mounted on the signal transfer medium, and the shielding of the EMI, can be increased. Accordingly, reliability of the panel can be increased.

While the present invention has been particularly shown and described with reference to exemplary embodiments thereof, it will be understood by those of ordinary skill in the art that various changes in form and detail may be made without departing from the spirit and scope of the present invention as defined by the following claims.

What is claimed is:

1. A plasma display apparatus, comprising:
a panel on which images are displayed;
a circuit board for driving the panel;
a chassis base for supporting the panel and the circuit board;
a case for accommodating the panel, the circuit board, and the chassis base;
a signal transfer unit, on which at least one device is mounted, for transmitting electrical signals between the panel and the circuit board by connecting the panel to the circuit board;
a porous protection plate having a plurality of pores, and disposed on an outer surface of the signal transfer unit for conducting heat away from the signal transfer unit; and
a reinforcing member disposed on at least one surface of the chassis base for preventing bending of the chassis base, wherein said at least one device mounted on the signal transfer unit is disposed on the reinforcing member.

2. The plasma display apparatus of claim 1, wherein the signal transfer unit comprises one of a tape carrier package (TCP), a chip on film (COF), and a chip on board (COB).

3. The plasma display apparatus of claim 1, further comprising a heat transfer member disposed between the chassis base and the panel for dissipating heat from the panel.

4. The plasma display apparatus of claim 1, further comprising a heat transfer member disposed between said at least one device mounted on the signal transfer unit and the protection plate.

5. The plasma display apparatus of claim 1, wherein the protection plate is formed of a metal selected from the group consisting of Al, Cu, Ag, Au, Fe, Ni, stainless steel and brass.

6. The plasma display apparatus of claim 1, wherein the protection plate is formed of a material selected from the group consisting of carbon, graphite, carbon nanotube and carbon fiber.

7. The plasma display apparatus of claim 1, wherein the case includes a front cabinet disposed in front of the panel, and a back cover disposed on a rear of the circuit board and coupled to the front cabinet, and wherein a stacking portion formed of a porous material is disposed on an inner surface of the back cover.

8. The plasma display apparatus of claim 7, wherein the stacking portion is formed of a material selected from the group consisting of carbon, graphite, carbon nanotube and carbon fiber.

9. A plasma display apparatus comprising:
a panel on which images are displayed;
a circuit board for driving the panel;
a chassis base for supporting the panel and the circuit board;
a case for accommodating the panel, the circuit board, and the chassis base;
a signal transfer unit, on which at least one device is mounted, for transmitting electrical signals between the panel and the circuit board by connecting the panel to the circuit board; and
a porous protection plate having a plurality of pores, and disposed on an outer surface of the signal transfer unit for conducting heat away from the signal transfer unit;
wherein an end of the chassis base has a bent portion of a predetermined length, and said at least one device mounted on the signal transfer unit is disposed on an outer surface of the bent portion.

10. A plasma display apparatus, comprising:
a panel on which images are displayed;
a circuit board for driving the panel;
a chassis base for supporting the panel and the circuit board;
a case for accommodating the panel, the circuit board, and the chassis base;

a signal transfer unit, on which at least one device is mounted, for transmitting electrical signals between the panel and the circuit board by connecting the panel to the circuit board;

a porous protection plate having a plurality of pores, and disposed on an outer surface of the signal transfer unit for conducting heat away from the signal transfer unit; and boss portions disposed on the chassis base, the chassis base and the protection plate being coupled by screws and grounded via the boss portions.

11. A plasma display apparatus, comprising:

a panel on which images are displayed;

a circuit board for driving the panel;

a chassis base for supporting the panel and the circuit board;

a case for accommodating the panel, the circuit board, and the chassis base;

a signal transfer unit, on which at least one device is mounted, for transmitting electrical signals between the panel and the circuit board by connecting the panel to the circuit board; and a porous protection plate having a plurality of pores, and disposed on an outer surface of the signal transfer unit for conducting heat away from the signal transfer unit;

wherein the case includes a front cabinet disposed in front of the panel, and a back cover disposed on a rear of the circuit board and coupled to the front cabinet, and wherein a stacking portion formed of a porous material is disposed on an inner surface of the back cover; and wherein the stacking portion is formed of a metal selected from the group consisting of Al, Cu, Ag, Au, Fe, Ni, stainless steel and brass.

12. A plasma display apparatus, comprising:

a panel on which images are displayed;

a circuit board for driving the panel;

a chassis base for supporting the panel and the circuit board;

a case for accommodating the panel, the circuit board, and the chassis base;

a signal transfer unit, on which at least one device is mounted, for transmitting electrical signals between the panel and the circuit board by connecting the panel to the circuit board; and a porous protection plate having a plurality of pores, and disposed on an outer surface of the signal transfer unit for conducting heat away from the signal transfer unit;

wherein the case includes a front cabinet disposed in front of the panel, and a back cover disposed on a rear of the circuit board and coupled to the front cabinet, and wherein a stacking portion formed of a porous material is disposed on an inner surface of the back cover; and wherein the stacking portion is grounded to the chassis base.

13. A plasma display apparatus, comprising:

a panel on which images are displayed;

a circuit board for driving the panel;

a chassis base for supporting the panel and the circuit board;

a signal transfer unit, on which at least one device is mounted, for transmitting electrical signals between the panel and the circuit board by connecting the panel to the circuit board; and a case for accommodating the panel, the circuit board, and the chassis base;

wherein the case includes a front cabinet disposed in front of the panel, and a porous back cover having a plurality of pores, said porous back cover being coupled to the front cabinet and being disposed on a rear surface of the circuit board for conducting heat away from the circuit board; and wherein the porous back cover is grounded to the chassis base.

14. The plasma display apparatus of claim 13, wherein air flows through the pores of the porous back cover.

15. The plasma display apparatus of claim 13, wherein the porous back cover has a plurality of breather holes.

16. The plasma display apparatus of claim 13, wherein an inner surface of the porous back cover is colored black.

17. The plasma display apparatus of claim 13, further comprising a protection plate disposed on an outer surface of the signal transfer unit.

18. The plasma display apparatus of claim 17, wherein an inner surface of the protection plate is composed of a porous material.

19. The plasma display apparatus of claim 18, wherein the protection plate is formed of a material selected from the group consisting of Al, Cu, Ag, Au, Fe, Ni, stainless steel and brass.

20. The plasma display apparatus of claim 18, wherein the protection plate is formed of a material selected from the group consisting of carbon, graphite, carbon nanotube and carbon fiber.

21. The plasma display apparatus of claim 17, further comprising a heat transfer member disposed between said at least one device mounted on the signal transfer unit and the protection plate.

22. The plasma display apparatus of claim 13, wherein the signal transfer unit comprises one of a tape carrier package (TCP), a chip on film (COF), and a chip on board (COB).

23. The plasma display apparatus of claim 13, further comprising a heat transfer member disposed between the chassis base and the panel for dissipating heat generated by the panel.

* * * * *